United States Patent
Chakrabarti et al.

(10) Patent No.: US 6,214,178 B1
(45) Date of Patent: Apr. 10, 2001

(54) FOCUSED ION BEAM FORMATION OF ANGLED OPTOELECTRONIC DEVICES

(75) Inventors: Utpal Kumar Chakrabarti, Allentown, PA (US); David Reese Peale, Chatham, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/218,566

(22) Filed: Dec. 22, 1998

(51) Int. Cl.$^7$ .......................... C23C 14/46; H01L 21/306; H01L 21/20; C03C 25/02
(52) U.S. Cl. ......................................... 204/192.34; 216/66
(58) Field of Search .................. 204/192.34, 298.36, 204/192.12; 216/66

(56) References Cited

U.S. PATENT DOCUMENTS

| | | | |
|---|---|---|---|
| 4,869,780 | * 9/1989 | Yang et al. | 204/192.34 |
| 5,430,751 | 7/1995 | Weterings. | |
| 5,492,607 | * 2/1996 | Yap | 204/192.34 |

FOREIGN PATENT DOCUMENTS 3-292776 * 12/1991 (JP).

OTHER PUBLICATIONS

P. Reese Puckett, et al., "Ion Beam Etching", Thin Film Processes II, pp. 749–782, 1991.*

Y. Ochiai, et al., "Pressure and irradiation angle dependence of maskless ion beam assisted etching of GaAs and Si", J.Vac. Sci. Technol. B 3(1), pp. 67–70, Jan. 1985.*

Wendt, Vawter, Smith, Warren "Subwavelength, Binary Lenses at Infrared Wavelengths" J. Vac. Sci. Technol. B 15(6) Nov./Dec. 1997.

Harriot, Scotti, Cummings, Ambrose "Micromachining of Integrated Optical Structures" Appl. Phys. Lett. vol. 48 No. 25, Jun. 23, 1986.

Vasile, Niu, Nassar, Zhang, Liu "Focused Ion Beam Milling: Depth Control for Three–Dimensional Microfabrication" J. Vac. Sci. Technol. B 15(6) Nov./Dec.1997.

Sheng, Goh. Tung, Wang "Precision Transmission Electron Microscopy Sample Preparation Using a Focused Ion Beam by Extraction Method " J. Vac Sci. Technol B 15(3) May/Jun. 1997.

Cumming, Khandaker, Thoms, Casey "Efficient diffractive optics made by single–step electron beam lithography in solid PMMA" J. Vac. Sci. Technol. B 15(6), Nov./Dec. 1997.

* cited by examiner

Primary Examiner—Nam Nguyen
Assistant Examiner—Gregg Cantelmo
(74) Attorney, Agent, or Firm—Wendy W. Koba (57) ABSTRACT

Fabrication of an optoelectronic device is enhanced by using a focused ion beam to prepare one or more of the device's facet surfaces. In particular, a facet may be oriented at a nearly arbitrary angled with respect to the waveguide within the device by controlling the orientation between the focused ion beam source and the device waveguide. Such facets are useful as antireflection and refractive beamsteering surfaces.

6 Claims, 13 Drawing Sheets

FOCUSED ION BEAM FORMATION OF ANGLED OPTOELECTRONIC DEVICES

BACKGROUND OF THE INVENTION

The present invention relates to optical device fabrication and, more particularly, to the utilization of a focused ion beam technique to form optoelectronic devices with angled facets that exhibit minimal light scattering.

Semiconductor optical devices such as lasers, superluminant diodes, modulators and amplifiers typically use cleaved ends of the semiconductor crystal as substrates upon which coatings are applied to form mirror and/or antireflection coatings. In the case of a Fabry-Perot diode laser, the perpendicular orientation of the facets with respect to the laser waveguide provides a convenient mirror orientation which efficiently couples light back into the resonator cavity. In the case of other types of lasers, as well as amplifiers and superluminant diodes, the smooth cleaved facet produces very little light scattering which, in conjunction with anti-reflection coatings, produces the very low feedback levels crucial for optimal performance of these devices.

It is difficult to create antireflection coatings with the extremely low reflection coefficients needed for proper laser amplifier and superluminant diode performance through the conventional process of deposition of dielectric layers on facets oriented perpendicular to the device waveguide. In an effort to reduce reflections from an imperfectly coated facet, devices have been fabricated with the waveguide oriented at an angle off-normal with respect to the cleaved facet. With this orientation, the majority of any light reflected from the facet will not re-couple back into the active waveguide. This method is effective in reducing reflectivity, but has the disadvantage that the process results in angling both the front and rear mirrors; thus producing lower reflectivities at both facets. This lower-than-desired reflectivity of the rear facet leads to lower-than-optimal output power from superluminant diodes. In general, it would be desirous to have the rear facet normal to the device beam mode, while having the front mirror angled. To this end, devices have been produced wherein the waveguide was bent so that while both facets are cleaved, one end of the waveguide terminates perpendicular to a cleaved facet while the other end, because of the bent waveguide, terminates at an angle with respect to the waveguide. In these cases the fabrication of the angled or bent waveguides has been problematic. Another approach has been to make devices in which one facet has been etched at an angle using a mask on top of the device and reactive ion beam etching or chemically-assisted ion beam etching the facet as discussed in the article "Superluminescent Diodes with Angled Facet Etched by Chemically Assisted Ion Beam Etching", by C. F. Lin appearing in *Electronics Letters*, Vol. 27, No. 11, 1991, at p. 968. In particular, the article discusses removal of material in a plane extending vertically downward from the edge of the mask. This process is made difficult by the care needed to establish etching conditions that remove material straight down the desired vertical plane below the mask edge. Furthermore, serrations along the edge of the photolithographically defined mask are replicated down into the etched facet, producing striations and roughness that scatter light back into the active waveguide. This scattering, as mentioned above, reduces the antireflection property of the angled facet, thereby mitigating its usefulness.

It has been suggested by Harriot, Scotti et al. in an article appearing in *Applied Physics Letters*, Vol. 48, No. 25, 1986, at pp. 1704 et seq. that out of-plane light beams may be produced by etching wedge-shaped recesses into the device substrate by making cuts with a focused ion beam directed normal to the wafer surface such that the total dose delivered to each location defines the depth of the cut at that location. One wall of the wedge-shaped recess serves as the laser mirror while the other sloping side of the wedge acts as a turning mirror directing the light out of the plane of the substrate. A demonstration of this method was implemented using a focused ion beam to cut a series of layered rectangular cuts, with the cut in each successive layer being slightly smaller than the previous. In this way, a very finely-divided staircase may be etched into the device, producing an essentially vertical wall and an essentially sloping surface. The disadvantage of this technique is that such surfaces are not particularly smooth and, therefore, scatter light undesirably. In addition, this technique is sensitive to inhomogeneities in the material density, phase, and crystallographic orientation (for polycrystalline samples) which translate into unexpected fluctuations in the depth of the cut. This again results in a rough and uneven mirror surface which scatters light. Backscattered light re-entering the laser or amplifier constitutes unwanted reflectivity and compromises the performance of the device. Likewise, forward scattered light from different positions of the mirror surface will be out of phase with the specularly reflected light from the mirror and therefore contributes to spatial inhomogeneities in the phase of the outgoing wavefront (degrading the reflected beam quality).

Thus, a need remains in the art for improved methods of facet etching that produce minimal reflection of light in unwanted directions.

SUMMARY OF THE INVENTION

The need remaining in the art is addressed by the present invention, which relates to optical device fabrication and, more particularly to the utilization of a focused ion beam technique to form optoelectronic devices with angled facets which exhibit minimal light scattering.

In particular, the present invention relates to the utilization of a focused ion beam (FIB) technique to form angled facet and mirror surfaces that exhibit very low levels of light scattering. Such formations are particularly useful as antireflection facets in certain types of optoelectronic devices such as superluminant diodes, semiconductor laser amplifiers, distributed Bragg reflection (DBR) lasers, and distributed feedback (DFB) lasers. In accordance with the present invention, the substrate to be processed is tilted so that the final ion beam cut is made with the ion beam parallel (or nearly parallel) to the plane of the desired finished surface. With this inventive technique of using focused ion beam etching to create such angled facets, and selectively orienting the substrate, an optical device may be formed with a cleaved rear facet oriented perpendicular to the waveguide while the front facet may be angled with respect to the waveguide. Alternatively, devices may be produced with front and back facets angled at any predetermined angle.

It is an aspect of the present invention that a facet may be angled in either the vertical or horizontal planes, or a combination thereof. For the purposes of the present discussion, a "vertical angled" plane will be defined as any plane with its vector normal lying in the plane of the substrate. A "horizontally tilted" plane will be defined as any plane with its vector normal lying in the plane defined by the device's waveguide axis and the substrate normal vector. A plane at a "compound" angle will be defined as one in which the vector normal does not lie in either a "vertical angled" or "horizontally tilted" plane as defined above. Further, a combined facet and mirror structure, or any other combination of surfaces that exhibits low scattering may be made wherein the substrate is tilted at the necessary angle for the grazing incidence formation of each surface in turn.

These and other aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
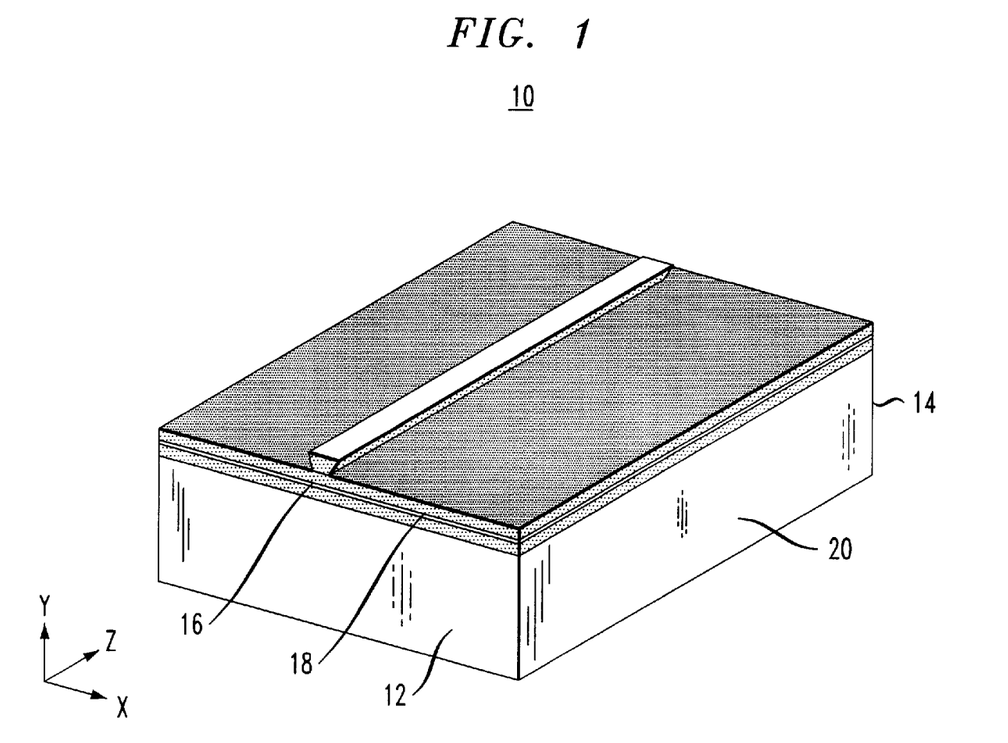
FIG. 1 illustrates a conventional ridge waveguide laser prior to using any focused ion beam (FIB) processing.

An exemplary unmodified ridge waveguide device 10 is illustrated in FIG. 1. Exemplary device 10 may comprise a laser, superluminant diode, or a semiconductor laser amplifier, depending upon the desired reflectivities of the front and back facets of the device. As shown, device 10 includes a front facet 12 and a rear facet 14, with an active stripe 16 formed within an epitaxial layer 18 deposited on a substrate 20. The design principles and the processes for the formation of the layer structures associated with such devices are well-known to those skilled in the art and need not be detailed here. A digital photograph of front facet 12 of device 10 is shown in FIG. 2.

Figure 2:
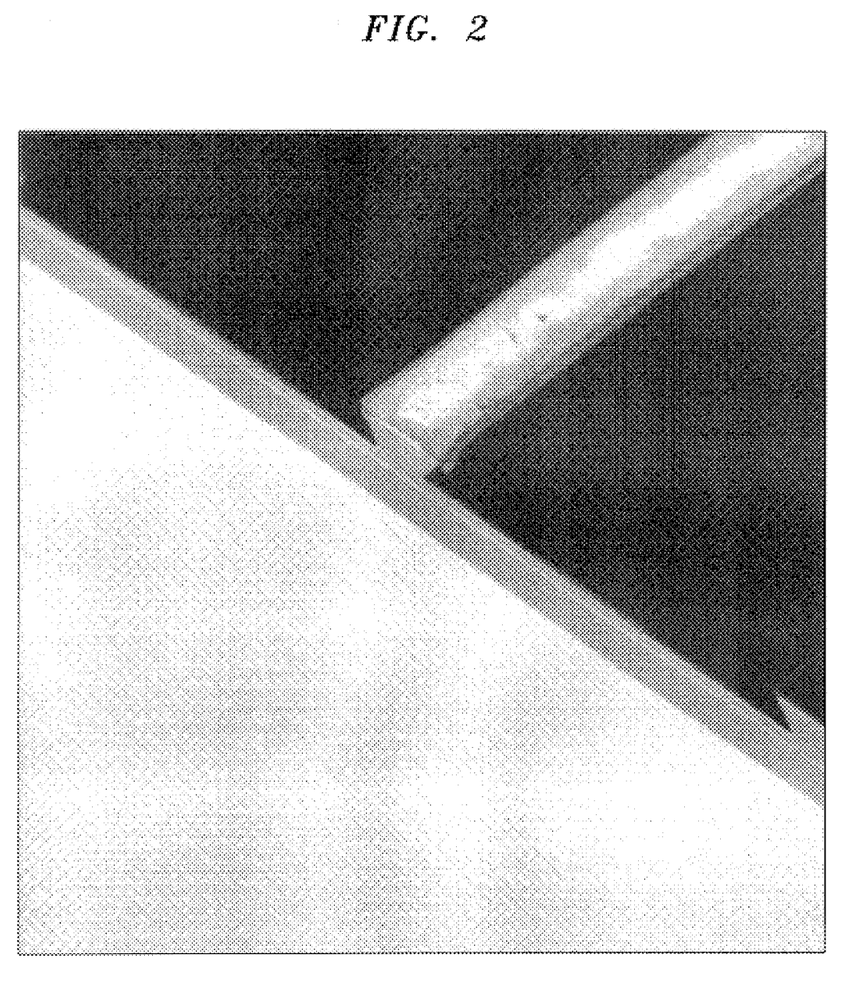
FIG. 2 is a digital photograph representation of the facet of a ridge waveguide laser as depicted in FIG. 1.

Referring to both FIGS. 1 and 2, active stripe 16 is oriented normal to front facet 12 (that is, active stripe extends in the z direction, where facet 12 is defined as lying in the x–y plane, as shown in FIG. 1). Therefore, if front facet 12 is not perfectly coated (in this case, with an anti-reflective coating), reflected light from facet 12 will be re-injected back into active stripe 16 (an undesirable effect for semiconductor optical amplifiers, distributed feedback lasers and superluminant diodes). Likewise, if serrations are left in etched facet 12, these serrations will scatter light back into active stripe 16 and also contribute to an uncontrolled reflectivity. Such serrations are common in conventionally prepared RIE etched facets. Serrations can also occur using FIB when the etch is performed through an overlying layer of metal, such as gold, which is frequently used as a contact metalization for the devices. Such serrations can be prevented by either designing the device to be free of metal at the end region where FIB etching is to take place, or by using a preliminary FIB step to remove the metal from the region of the facet to be cut.

These and other problems associated with unwanted reflections and scattering in optoelectronic devices are solved by using the angled FIB facet preparation technique of the present invention. As will be described in detail below, the angled facets are formed by tilting the optoelectronic substrate with respect to the FIB source so that the final ion beam cut is made with the ion beam parallel (or nearly parallel) to the plane of the desired finished surface. Since the material removal rate is a function of the incident angle between the ion beam and the substrate, it can be the case that the removal rate drops sharply as the incident angle approaches perfect grazing incidence. This can cause the resulting facet to form at an angle not perfectly parallel to the axis of the incident beam. For this reason, it is sometimes necessary to compensate the substrate orientation slightly (by a few degrees, for example), so as to produce the desired angle in the finished facet. The degree of compensation depends on the material being etched, as well as other factors.

Figure 3:
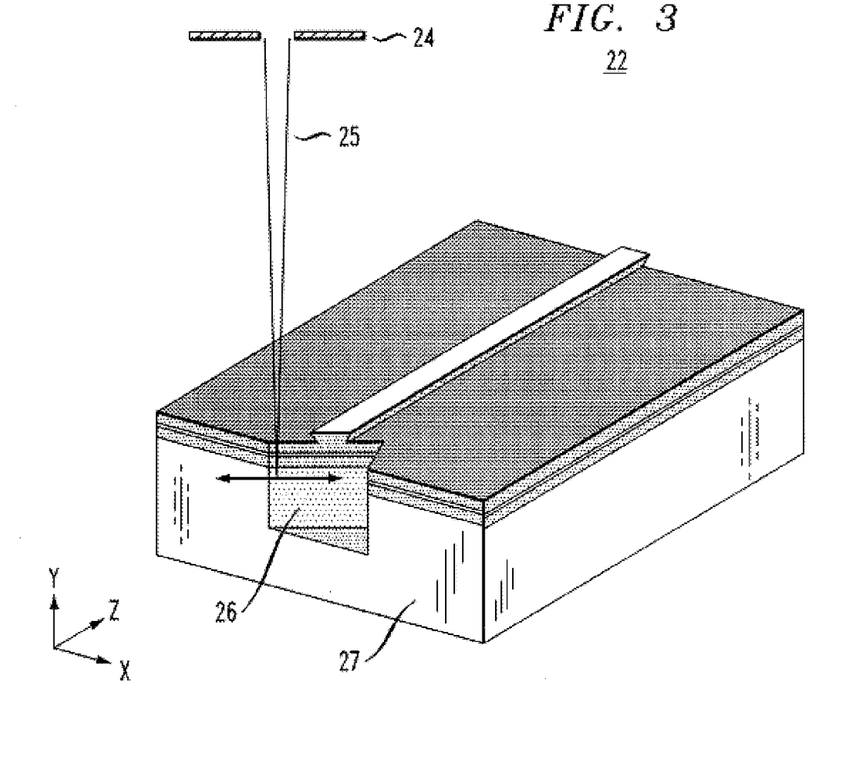
FIG. 3 contains a diagram of an exemplary arrangement used to form a vertical angled facet on an optoelectronic device by FIB etching in accordance with the present invention.

FIG. 3 contains a diagram illustrating the arrangement between an exemplary optoelectronic device 22 and a focused ion beam source 24 that will form a vertical angled facet 26 on device 22. As shown, the focused ion beam 25 exits source 24 and impinges front endface 27 of device 22, removing substrate material from device 22 until the desired angled facet is formed. The dosage, spot size and dwell time of the focused ion beam will control the depth of cut made into the substrate.

Figure 4:
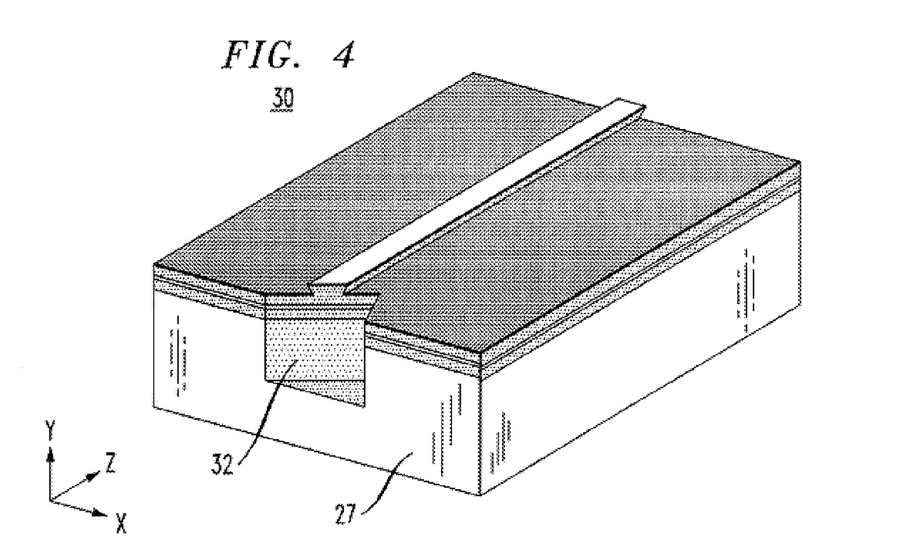
FIG. 4 illustrates a ridge waveguide laser including an angled antireflection facet lying in a vertical plane, as formed by FIB etching in accordance with the present invention.

FIG. 4 illustrates an exemplary ridge waveguide device 30 including a vertical angled front facet 32 formed using the focused ion beam (FIB) processing technique of the present invention. As with the process outlined in FIG. 3, facet 32 has been angled in the "vertical" plane. In this case, the formation of such a device includes the same processing steps, up to the cleaving of the front and rear facets, that would be used to form device 10 of FIG. 1. Once the front and rear facets have been cleaved, front facet 32 is etched using a focused ion beam oriented to remove a desired amount of material from the predetermined vertical area, as shown in FIG. 4.

Figure 5:
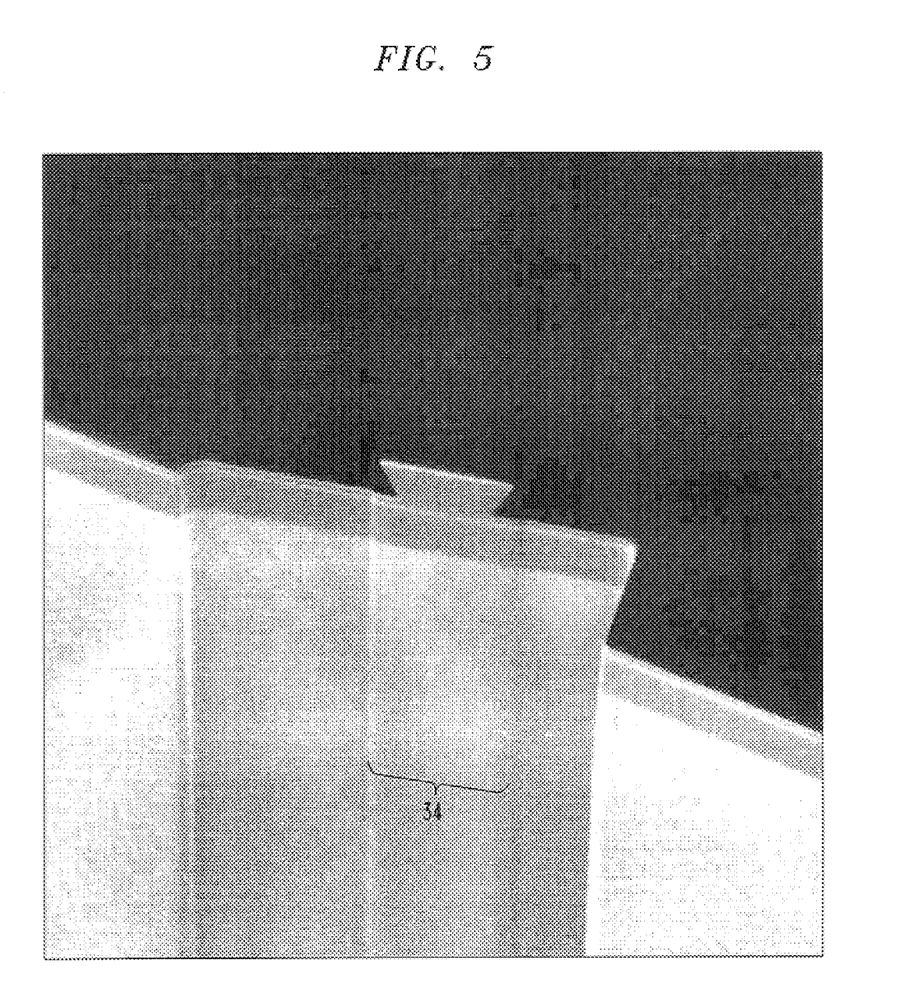
FIG. 5 is a digital photograph of the front facet of a ridge waveguide laser including an angled facet lying in the vertical plane as created by FIB etching and illustrated in FIG. 4.

FIG. 5 is a digital photograph of an actual angled front facet formed using the FIB technique of the present invention. The cut shown in FIG. 5 was produced with the device substrate oriented normal to the focused ion beam, as depicted in FIG. 3. The beam raster was programmed to execute a rectangular pattern with the pattern rotated with respect to the facet edge by a chosen amount. In this example, the facet was angled 12° with respect to the cleaved facet plane, although larger (or smaller) angles may be deemed desirable, depending upon the desired device, the application, and a number of other factors.

In the example illustrated in FIGS. 4 and 5, the FIB spot size was approximately 280 nm in diameter. As a result, the ridge structure above the substrate slowed the penetration of the cut into the facet and produced a rampart-like extension 34 of the facet below the ridge. This extension is smooth and blends into the lateral extensions of the facet in a region where the beam intensity is small. Therefore, this feature is of little consequence to the facet quality. Nonetheless, this tendency can be reduced by using a smaller beam spot size. Furthermore, other device structures, such as buried heterojunction devices, do not exhibit this tendency, since they lack the non-uniformity (i.e., ridge) that leads to this rampart-like extension.

Figure 6:
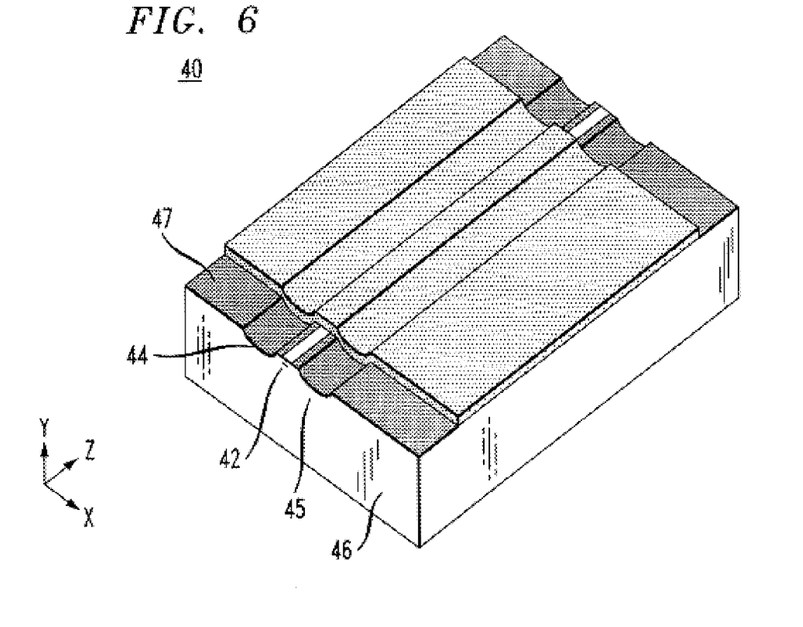
FIG. 6 illustrates a conventional buried heterostructure laser.

As mentioned above, the FIB-angled facet technique of the present invention is suitable for use with a variety of optoelectronic devices. FIG. 6 illustrates an exemplary buried heterostructure device 40 prior to any FIB etching modifications of the present invention. Buried heterostructure device 40 includes an active region 42 disposed within a ridge between a pair of etched troughs 44,45. In this pre-FEB facet etch view, a front endface 46 is shown as perpendicular to top major surface 47 of device 40. As with the ridge waveguide device discussed above, an angled facet may be formed on a buried heterostructure device using the oriented FIB etching technique of the present invention.

Figure 7:
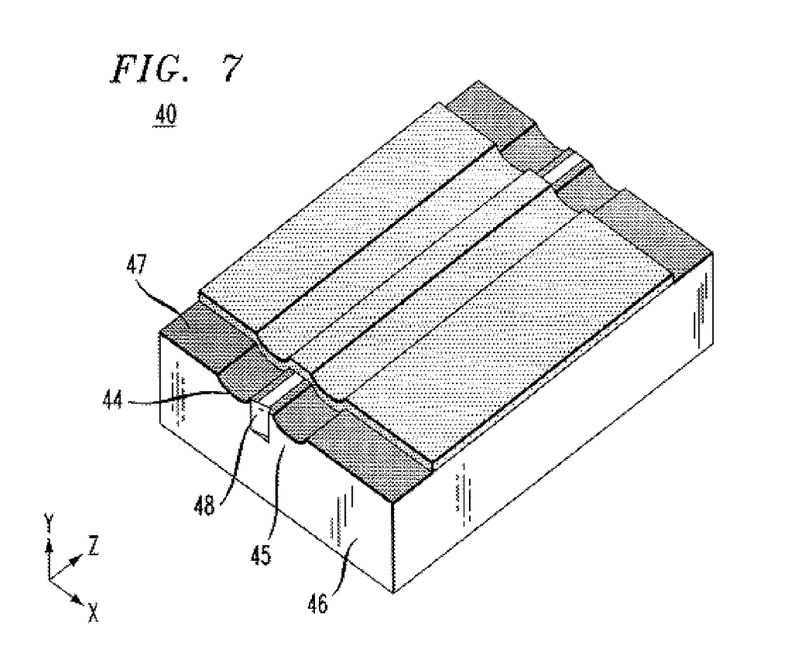
FIG. 7 illustrates a buried heterostructure laser including an angled antireflection facet lying in a vertical plane formed in accordance with the present invention.

FIG. 7 illustrates buried heterostructure device 40 including a vertical angled front facet 48 formed using the arrangement of the present invention as shown in FIG. 3. In particular, device 40 is tilted with respect to the focused ion beam source (see FIG. 3) so that the ion beam will be parallel (or nearly parallel) with the final angled surface of front facet 48. The ion beam is rastered against front endface 46 and continues to remove substrate material until the final vertical angled front facet 48 is formed. In one embodiment, device 40 may be tilted at an angle of 12° with respect to the ion beam source, where this angle has been found to provide an angled facet 48 with sufficiently low scattering and reflection back into active region 42. It is to be understood that this angle is exemplary, and any other desired tilt angle may be used in accordance with the teaching of the present invention.

Figure 8:
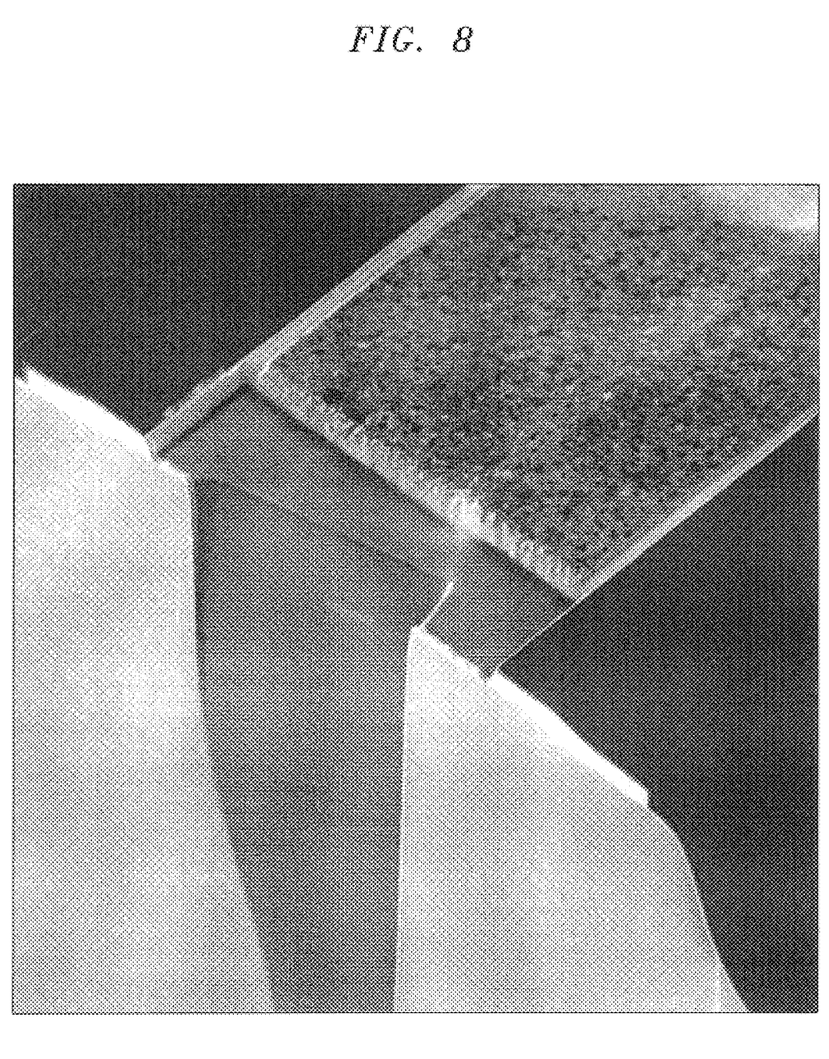
FIG. 8 is a digital photograph of the front facet of a buried heterostructure laser including an angled facet lying the vertical plane as created by FIB etching and illustrated in FIG. 7.

FIG. 8 is a digital photograph of an exemplary buried heterostructure device with a facet angled in a vertical plane. In this exemplary device, there is contact metal extending to the front edge of the device. Cutting directly through the grain structure of this metal produces serrations in the underlying material. Such serrations cause scattering of the light, which increase the reflectivity of the facet. This metal was therefore removed from the region to be cut. A preliminary FIB cut encompassing the region of the intended angled facet cut, and just deep enough to remove the overlying metal is sufficient to eliminate the formation of serrations. As can be seen in the photograph, the facet is smooth and free of any defects that could scatter light.

Figure 9:
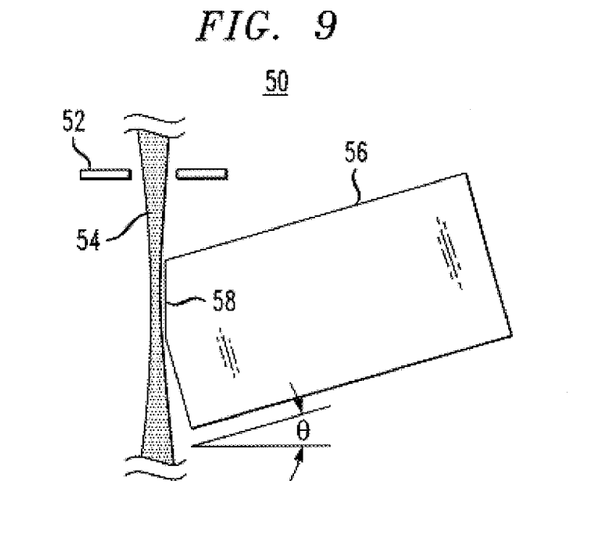
FIG. 9 contains a diagram of an exemplary arrangement used to form a horizontally tilted facet on an optoelectronic device by FIB etching in accordance with the present invention.

An exemplary process for forming a horizontally tilted facet is shown in FIG. 9. A side view of device 50 is shown, where a focused ion beam source 52 is disposed above device 50. Prior to turning on source 52, device 50 is oriented at the desired angle, as shown. In this case, the device substrate is tilted 15°, facet downward, with respect to the focused ion beam. As shown in FIG. 9, once device 50 is properly oriented, source 52 is activated so as to allow the focused ion beam 54 to impact top surface 56 of device 50 to remove the desired material and form horizontally angled facet 58. In this case, the beam impacting the device is moved in a rectangular raster pattern that is aligned with the edge of the facet so as to remove a portion of the ridge, active stripe and some of the substrate. The resulting etch is a smooth cut, formed reproducibly at the desired tilt angle. The angle can be set to any value, and is not limited to angles produced by crystallographic chemical etches. It should be noted that the facet could be tilted in the opposite sense to that shown in this example(that is "facet up"), or in any combination of vertical and horizontal planar orientations.

Figure 10:
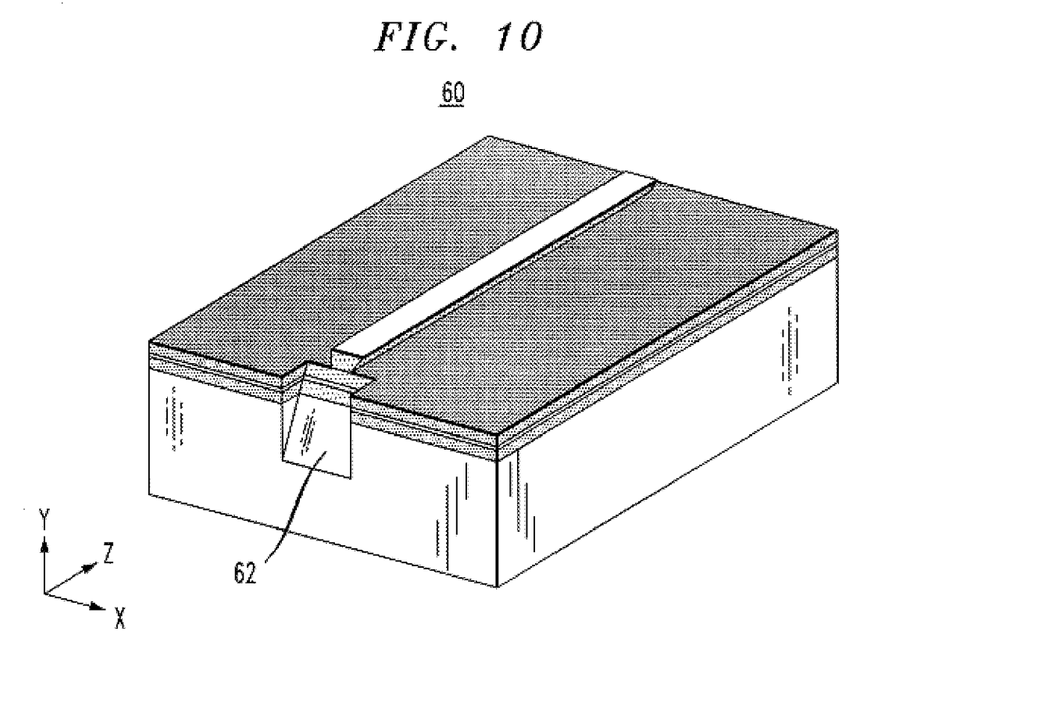
FIG. 10 illustrates a ridge waveguide laser including a horizontally tilted facet, formed using the FIB technique of the present invention.
Figure 11:
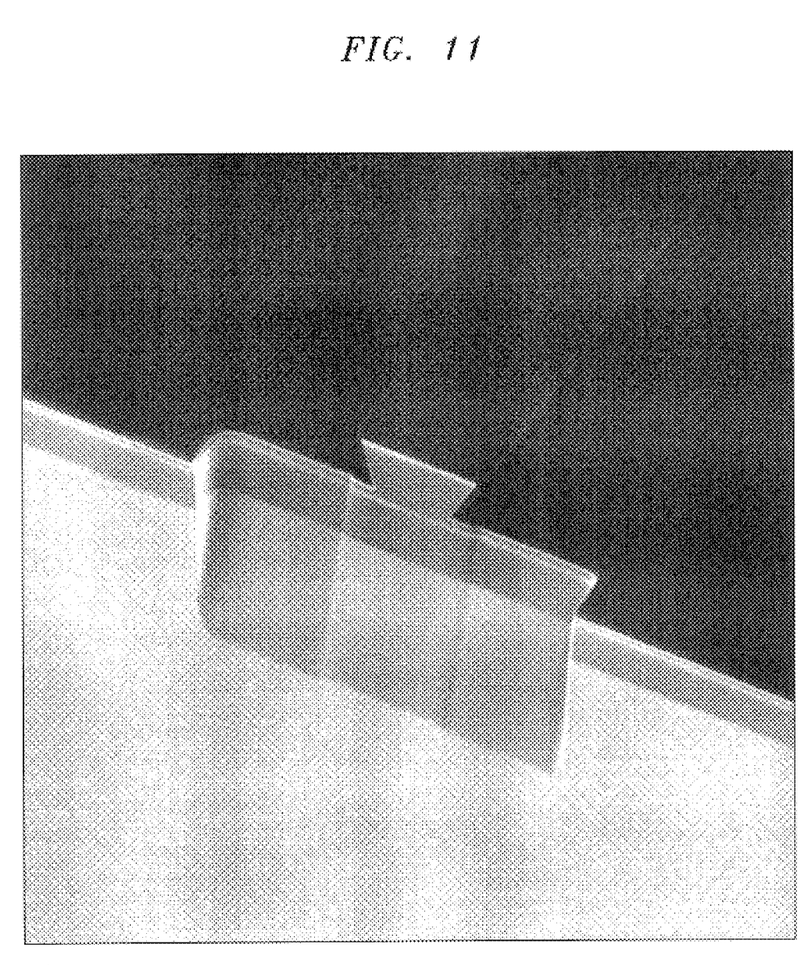
FIG. 11 is a digital photograph of the front facet portion of a ridge waveguide laser including a horizontally tilted facet created by the FIB process in accordance with the present invention.

A ridge waveguide device 60 including a facet 62 tilted "horizontally" as described above is illustrated in FIG. 10, and also shown in the digital photograph of FIG. 11. In this particular embodiment, a focused ion beam is used to form a facet that is angled with respect to the horizontal plane of the device (i.e., a "horizontally tilted" facet) as depicted in FIG. 9. Similar to the arrangement with a vertical facet as depicted in FIGS. 4 and 5, the formation of a horizontally tilted facet allows for the active stripe to be angled with respect to the normal facet surface, thus significantly reducing the amount of optical feedback as compared with conventional devices employing facets oriented normal to the beam axis.

The horizontally tilted facet refracts the emitted light out of the plane of the device substrate. This may be advantageous in a number of possible applications, particularly since no reflecting surface is needed to achieve such out-of-plane emission. In the arrangement depicted in FIGS. 10 and 11, facet 62 is angled upward from the vertical plane by approximately 15°. Refraction of the beam across the semiconductor-to-air interface bends the beam downward as shown by approximately 65° with respect to the angled facet normal (i.e., 50° with respect to the unetched facet normal). When the exemplary device is packaged "upside down", this deflection will direct the beam out of the plane of the device and its mounting substrate, making the beam accessible to external optics. The fact that the beam is refracted out of plane without the use of an additional reflecting surface not only simplifies the fabrication process, but also improves the efficiency of the output, since the losses associated with mirror absorption, capture cross sections, and imperfections in the reflector surface are all eliminated.

Figure 12:
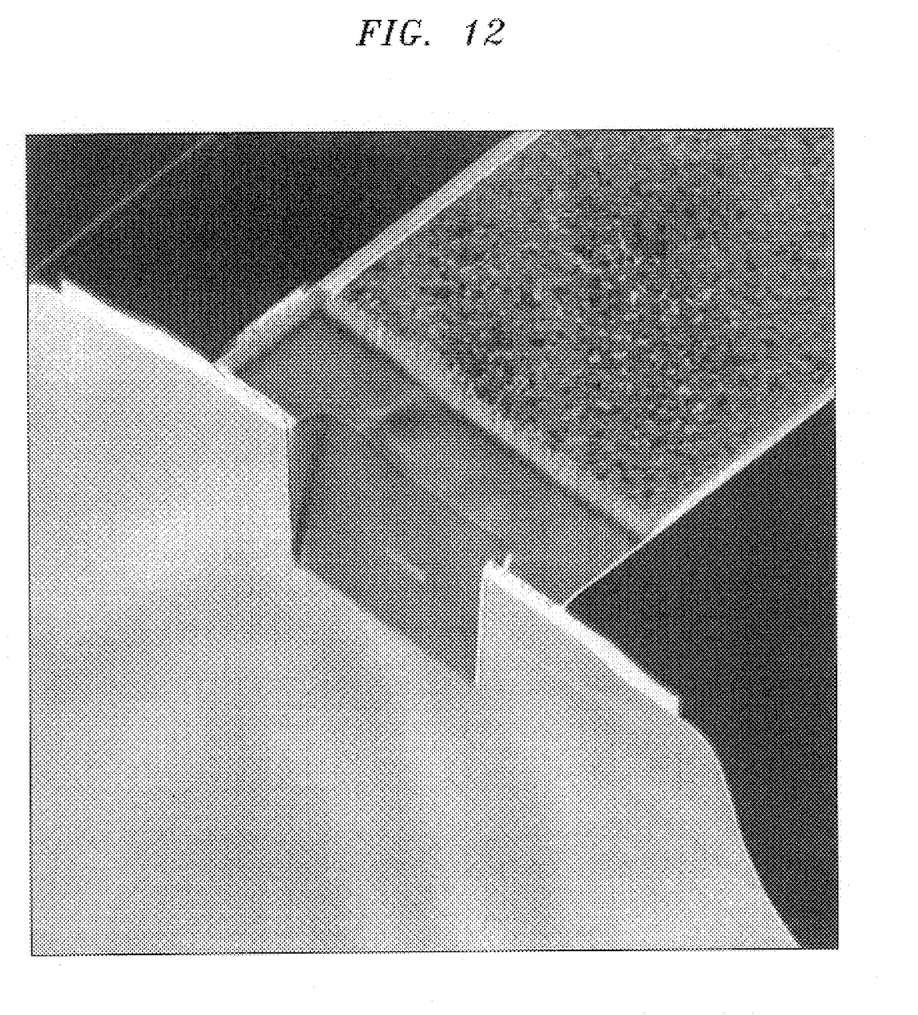
FIG. 12 is a digital photograph of the front facet portion of a buried heterostructure laser including a horizontally tilted facet created by the FIB process in accordance with the present invention.

FIG. 12 contains a digital photograph of a similarly-angled facet implemented in a buried heterostructure device. As with the buried heterostructure device of FIG. 8, a portion of the overlying metal contact layer is removed prior to forming the horizontally angled facet so as to prevent the formation of serrations in the facet surface.

Figure 13:
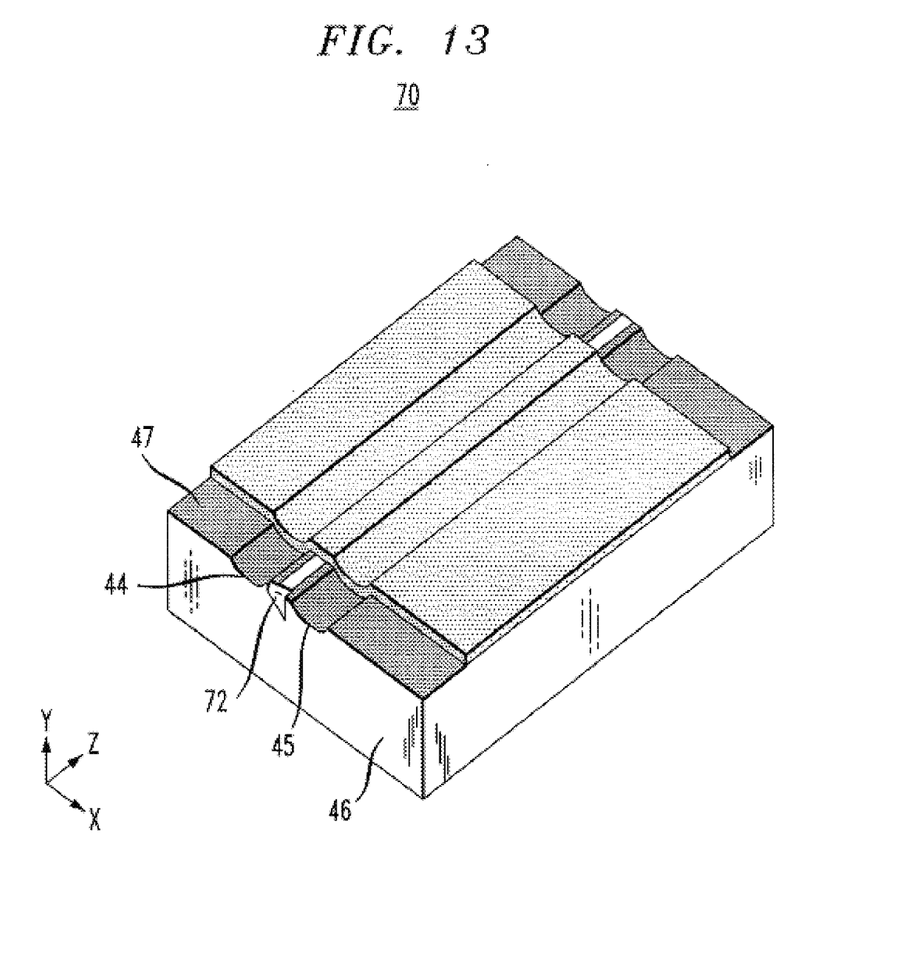
FIG. 13 illustrates a buried heterostructure laser including an angled facet oriented at a compound angle.
Figure 14:
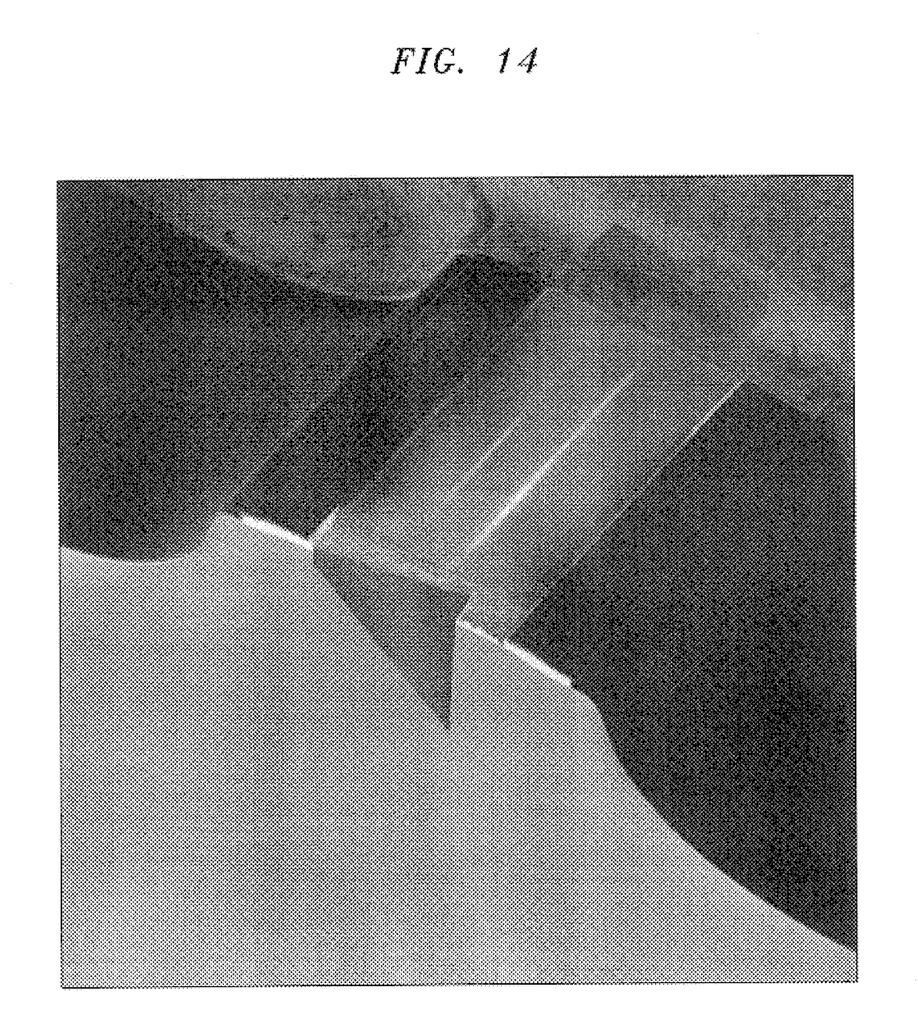
FIG. 14 is a digital photograph of the front facet portion of a buried heterostructure laser including a compound angled facet created by the FIB process in accordance with the present invention.
Figure 15A:
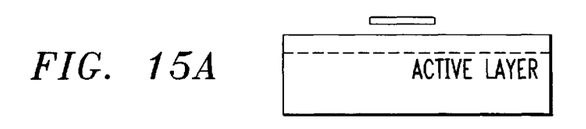
FIG. 15 illustrates an exemplary sequence of steps for the formation of a facet/mirror combination wherein the substrate is tipped appropriately for the formation of each surface.
Figure 15B:
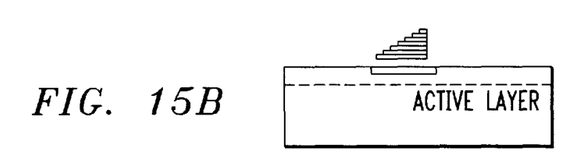
Figure 15C:
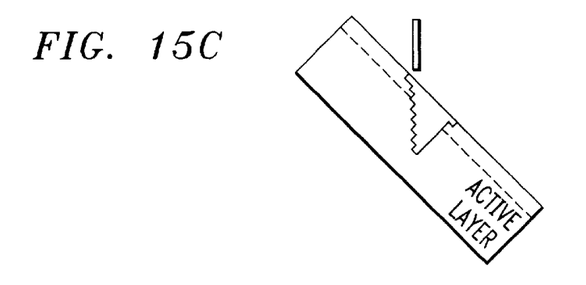
Figure 15D:
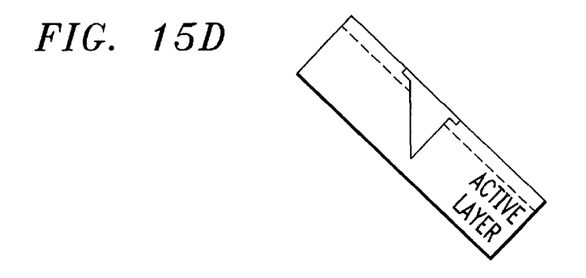
Figure 15E:
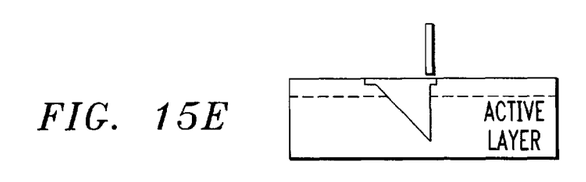
Figure 15F:
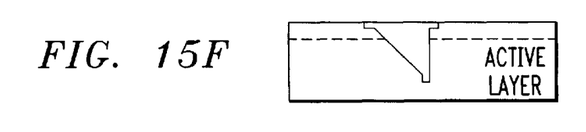

FIG. 13 illustrates a buried heterostructure device 70 including an angled front facet 72 oriented at a compound angle with respect to facet 46 and top surface 47. Such a facet is formed by orienting the device so that the facet is tilted (up or down), and rotated with respect to the edge of the beam raster which defines the plane of the finished cut. FIG. 14 is a digital photograph of such a compound facet fabricated in a buried heterostructure device. The facet is tilted "horizontally" by 12° and also angled "laterally" by 12° as well.

FIG. 15 contains a diagram illustrating the process by which a facet and associated reflective mirror surface may be formed. The rough profile of the majority of the etched feature is fabricated using a suitable conventional method, such as that described in the above-cited Scotti et al. reference. The formation of this rough profile leaves a fine staircase and slightly roughened surface for the reflector surface. Subsequently, the sample is reoriented so that a finishing cut can be made to smooth the reflector surface. Finally, it is often desirable to make a finishing cut on the vertical facet surface as well, so the device is reoriented again for that step.

Figure 16:
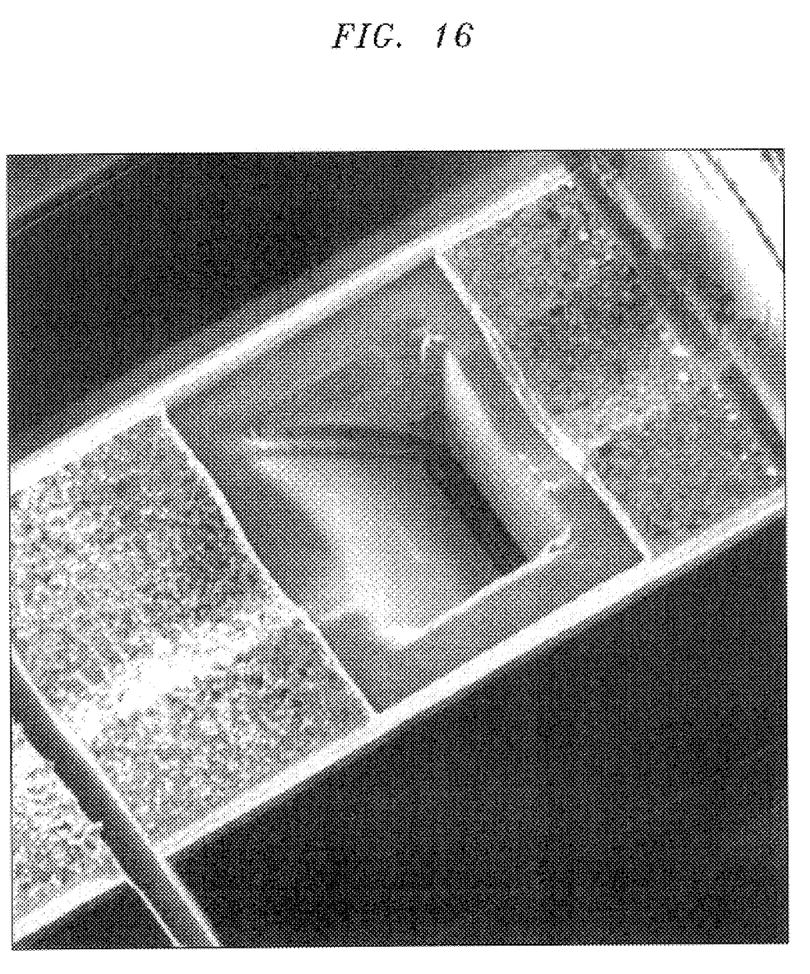
FIG. 16 is a digital photograph of a facet/mirror combination made according to the procedure depicted in FIG. 15.

FIG. 16 is a digital photograph of an exemplary combination facet and beam turning reflector etched according to the procedure outlined in FIG. 15. In this exemplary structure, the facet is oriented perpendicular to the device waveguide. However, such structures can also be fabricated with angled facets.

As is well-known to those skilled in the art, the focused ion beam etching process may be enhanced by the introduction of certain gases into the vacuum environment. The ion beam chemically decomposes and activates the etching gas, thereby producing a chemically-assisted etching mechanism in addition to the physical sputtering mechanism of the ion beam alone. Since the gas is decomposed and activated only within the volume of the focused ion beam, the etching is confined to the region of material in the immediate vicinity of the beam. Typically, only the surface area impacted by the beam is etched significantly. The specific etch-assist gas used depends on the material being etched. Typically, $Cl_2$ (or chlorine containing compounds) are used for etching metals, $XeF_2$ is used for etching dielectrics, and water vapor is used for etching photoresists and other polymer-based materials.

One well-known advantage of chemically-assisted etching is that the volume of material removed can be enhanced by one to two orders of magnitude as compared to unassisted FIB etching. This reduces the degree of surface damage due to implantation which may be of value for certain device facet applications. A second advantage is a reduction in the amount of sputtered material that re-deposits on nearby surfaces around the etching area. This is especially important in the combined facet-mirror structures in which the ejecta from one surface (i.e., the mirror) can contaminate the other surface (e.g., the facet). The use of chemical gas assisted FIB etching of angled facets is also considered to lie within the scope of the present invention.

Other and further uses of a focused ion beam in the preparation of facets of optical devices will be apparent to those skilled in the art and are considered to fall within the spirit and scope of the present invention. In particular, it is to be understood that the various processes described above may be used in association with a variety of optical devices including, but not limited to, laser diodes, superluminant diodes, distributed feedback lasers, distributed Bragg reflector lasers, semiconductor optical amplifiers and modulators, fiber optical amplifiers, planar waveguide facets, and planar waveguide turning mirrors, reflectors and retroreflectors.

What is claimed is:

1. A method of forming angled facets on an optoelectronic device to minimize scattering of light out of a defined waveguide axis at an endface, the method comprising the steps of:
   a) providing said optoelectronic device defined as a structure comprising materials of different indices of refraction arranged to form an optical waveguide along the defined waveguide axis and including opposing first and second endfaces;
   b) providing a focused ion beam source;
   c) orienting said optoelectronic device with respect to said focused ion beam source such that a focused ion beam exiting said focused ion beam source will be parallel with a predetermined angled facet plane at a first endface of said optoelectronic device;
   d) activating said focused ion beam source to generate said focused ion beam for impinging said predetermined angled facet plane of said oriented optoelectronic device and removing material from said first endface of said oriented optoelectronic device, thereby forming an angled facet on said oriented optoelectronic device; and
   e) repeating steps c) and d) for the second, opposing endface of the optoelectronic device so as to from both a front angled facet and a rear angled facet.

2. The method as defined in claim 1 wherein in performing step a), providing an optoelectronic device further defined as a planar optoelectronic device and in performing step c), orienting said planar optoelectronic device such that a vector normal of a formed angled facet lies in a plane of said planar optoelectronic device to form a vertical angled facet.

3. The method as defined in claim 1 wherein in performing step a), providing an optoelectronic device further defined as a planar optoelectronic device, and in performing step c) orienting said planar optoelectronic device such that a vector normal of a formed angled facet lies in a plane defined by said optoelectronic device waveguide axis and a vector normal to form a horizontally tilted facet.

4. The method as defined in claim 1 wherein in performing step a), providing an optoelectronic device further defined as a planar optoelectronic device and in performing step c), orienting said planar optoelectronic device so that a vector normal of a formed angled facet does not lie in any plane associated with said planar optoelectronic device and said optoelectronic device waveguide axis, thereby forming a compound angled facet.

5. The method as defined in claim 1 wherein steps c) and d) are repeated at the first endface of said optoelectronic device with first and second orientations of the focused ion beam source to form said optoelectronic device with both an angled facet using the first orientation and a reflecting surface using the second orientation.

6. The method as defined in claim 1 wherein the method further comprises the step of:
   introducing gases to surround the optoelectronic device during the activation of step d) to provide chemical-assisted formation of an angled facet on the first endface of said optoelectronic device.

* * * * *